United States Patent
Murakami

(10) Patent No.: US 8,780,253 B2
(45) Date of Patent: Jul. 15, 2014

(54) SOLID-STATE IMAGING DEVICE AND SIGNAL PROCESSING CIRCUIT

(75) Inventor: Ichiro Murakami, Kanagawa (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 13/311,083

(22) Filed: Dec. 5, 2011

(65) Prior Publication Data

US 2012/0119069 A1 May 17, 2012

Related U.S. Application Data

(62) Division of application No. 11/024,269, filed on Dec. 28, 2004, now Pat. No. 8,072,529.

(30) Foreign Application Priority Data

Jan. 6, 2004 (JP) .................................. 2004-000763

(51) Int. Cl.
*H04N 5/225* (2006.01)
*G02B 13/16* (2006.01)

(52) U.S. Cl.
USPC ........... 348/335; 348/340; 348/345; 348/348; 348/350; 348/352

(58) Field of Classification Search
USPC .................. 348/335, 340, 345, 348, 350, 352, 348/294–324; 250/208.1; 257/290–292
See application file for complete search history.

(56) References Cited

U.S. PATENT DOCUMENTS

| | | | |
|---|---|---|---|
| 6,137,535 A | 10/2000 | Meyers | |
| 6,476,851 B1 * | 11/2002 | Nakamura | ...................... 348/65 |
| 6,794,692 B2 | 9/2004 | Suzuki | |
| 6,933,976 B1 | 8/2005 | Suzuki | |
| 2001/0035910 A1 * | 11/2001 | Yukawa et al. | ............... 348/349 |
| 2004/0100570 A1 | 5/2004 | Shizukuishi | |
| 2005/0035377 A1 | 2/2005 | Kamimura et al. | |

FOREIGN PATENT DOCUMENTS

| | | |
|---|---|---|
| JP | 07-050401 | 2/1995 |
| JP | 09-205589 | 8/1997 |
| JP | 2000-349268 | 12/2000 |

* cited by examiner

*Primary Examiner* — Yogesh Aggarwal
(74) *Attorney, Agent, or Firm* — Rader, Fishman & Grauer PLLC

(57) ABSTRACT

A solid-state imaging device includes a semiconductor substrate having a principal surface, and three or more pixel regions formed in at least one direction of two different directions along the principal surface of the semiconductor substrate. Each pixel region includes a plurality of photoelectric conversion regions having different sensitivities. The photoelectric conversion region having the highest sensitivity in peripheral pixel regions of the pixel regions has a higher sensitivity than the photoelectric conversion region having the highest sensitivity in a central pixel region of the pixel regions.

12 Claims, 4 Drawing Sheets

SOLID-STATE IMAGING DEVICE AND SIGNAL PROCESSING CIRCUIT

CROSS REFERENCES TO RELATED APPLICATIONS

This is a Divisional Application of the patent application Ser. No. 11/024,269, filed Dec. 4, 2004, which claims priority from Japanese Patent Applications P2004-000763 filed with the Japan Patent Office on Jan. 6, 2004, respectively, the entire contents of which being incorporated herein by reference.

BACKGROUND OF THE INVENTION

1. Field of the Invention

The present invention relates to a solid-state imaging device with simple sensitivity correction and to a signal processing circuit.

2. Description of the Related Art

In a typical CCD (charge-coupled device) solid-state imaging device, stored charges output from two-dimensionally arranged photoelectric converters are sequentially output in an inter-line transfer manner or a progressive scanning manner to output a captured image.

FIG. 4 is a plan view of a typical CCD solid-state imaging device 101.

As shown in FIG. 4, the CCD solid-state imaging device 101 includes a matrix array of photoelectric converters 102, vertical transfer devices 103 between the photoelectric converters 102 in the horizontal direction, and horizontal transfer devices 104 connected to the lower ends of the vertical transfer devices 103. Each of the photoelectric converters 102 photoelectrically converts incident light to generate an electric charge to be stored.

The vertical transfer devices 103 are driven by, for example, a four-phase driving pulse to read the electric charges stored in the photoelectric converters 102 at certain intervals, and sequentially transfer the read electric charges to the horizontal transfer devices 104. The horizontal transfer devices 104 are driven by, for example, a two-phase driving pulse to sequentially transfer the electric charges transferred from the vertical transfer devices 103 to a charge detector 105 via a final horizontal transfer electrode LH. The charge detector 105 stores the charges in a floating diffusion unit FD via an output gate HOG, and outputs an electrical signal via an amplification circuit 106. The charge detector 105 further includes a reset drain RD and a reset gate RG adjacent to the floating diffusion unit FD for discharging the charges stored in the floating diffusion unit FD, if necessary.

Thus, the CCD solid-state imaging device 101 converts electric charges generated by the photoelectric converters 102 into an electrical signal, and outputs the converted electrical signal.

Recent CCD solid-state imaging devices with small chip size and multiple pixels have small cells. However, as the cell size is reduced, the size of photoelectric converters and vertical transfer devices must also be reduced, leading to reduction in dynamic range.

In order to improve the dynamic range, a CCD solid-state imaging device includes a high-sensitivity photoelectric converter and a low-sensitivity photoelectric converter that are adjacent to each other, and an imaging signal output from the CCD solid-state imaging device is processed by an external circuit (see, for example, T. Komobuchi, T. Yamada, A. Fukumoto, Y. Matsuda, M. Masukawa, and S. Terakawa, "Kou Dynamic Range (Wide Dynamic Range) 'Hyper-D CCD'", the Journal of the Institute of Image Electronics Engineers of Japan, Vol. 25, No. 4, 1996).

In this approach, the adjacent photoelectric converters 102 of the CCD solid-state imaging device 101 are separated into high-sensitivity photoelectric converters and low-sensitivity photoelectric converters by making the charge storage time of the high-sensitivity photoelectric converters different from that of the low-sensitivity photoelectric converters. In order to form a pixel pair having an adjacent high-sensitivity photoelectric converter and low-sensitivity photoelectric converter, an external circuit adds imaging signals obtained from the high-sensitivity photoelectric converter and the low-sensitivity photoelectric converter. The imaging signal output from the high-sensitivity photoelectric converter is sliced at a certain level before it is added.

In light incident on a CCD solid-state imaging device, the ratio of oblique incident light components in the incident light on pixels in a peripheral portion of the CCD solid-state imaging device is higher than the ratio of oblique incident light components in the incident light on pixels in a central portion of the CCD solid-state imaging device. Generally, oblique incident light components are more diffuse and less focused. Thus, if photoelectric converters in the central portion of the CCD solid-state imaging device are formed in the same fashion as the peripheral photoelectric conversion region, the photoelectric conversion efficiency can be reduced, resulting in low sensitivity.

SUMMARY OF THE INVENTION

In one aspect of the present invention, a solid-state imaging device includes a semiconductor substrate having a principal surface, and three or more pixel regions formed in at least one direction of two different directions along the principal surface of the semiconductor substrate. The three or more pixel regions include a central pixel region and peripheral pixel regions around the central pixel region, and each pixel region includes a plurality of photoelectric conversion regions having different sensitivities. The photoelectric conversion region having the highest sensitivity in the peripheral pixel regions has a higher sensitivity than the photoelectric conversion region having the highest sensitivity in the central pixel region.

In another aspect of the present invention, a signal processing circuit for processing a signal that is photoelectrically converted by a plurality of pixel regions of a solid-state imaging device is included in or is external to the solid-state imaging device. The plurality of pixel regions include a central pixel region and peripheral pixel regions around the central pixel region. The signal processing circuit includes a circuit that corrects for gains of the central pixel region and peripheral pixel regions in accordance with an f value.

In the solid-state imaging device of the present invention, the sensitivity of a photoelectric conversion region having the highest sensitivity in the peripheral pixel regions is higher than that of a photoelectric conversion region having the highest sensitivity in the central pixel region. Thus, so-called shading caused by more oblique incident light components in the light incident on a peripheral portion of the solid-state imaging device than in a central portion thereof, namely, shading caused by the photoelectric conversion regions having the highest sensitivity in the pixel regions, can be corrected for. Therefore, the solid-state imaging device provides high-quality captured images.

The signal processing circuit of the present invention corrects for gains of the central pixel region and peripheral pixel regions in accordance with an f value. For example, if the photoelectric conversion regions having the highest sensitivity in the central pixel region and peripheral pixel regions are suppressed from causing shading, the low-sensitivity photoelectric conversion regions may cause worse shading. However, shading caused in the regions other than the photoelectric conversion regions having the highest sensitivity in the pixel regions can be corrected for. Therefore, solid-state imaging device provides high-quality captured images.

DESCRIPTION OF THE PREFERRED EMBODIMENTS

In order to correct for shading that is caused in a solid-state imaging device to improve the quality of a captured image, according to the present invention, high-sensitivity photoelectric conversion regions in peripheral pixel regions of the solid-state imaging device have a higher sensitivity than a high-sensitivity photoelectric conversion region in a central pixel region of the solid-state imaging device. Thus, shading caused by the high-sensitivity photoelectric conversion regions can be corrected for. Moreover, shading caused by the regions other than the high-sensitivity photoelectric conversion regions can be corrected for by correcting for gains of the central pixel region and peripheral pixel regions in accordance with an f value.

The solid-state imaging device and signal processing circuit of the present invention are suitable for application to a variety of CCD imaging devices.

First Embodiment

A solid-state imaging device according to a first embodiment of the present invention will be described with reference to FIGS. 1 and 2. FIG. 2 is a plan view of the solid-state imaging device, and FIG. 1 is a schematic cross-sectional view of the solid-state imaging device, taken along a line I-I of FIG. 2.

Figure 1:
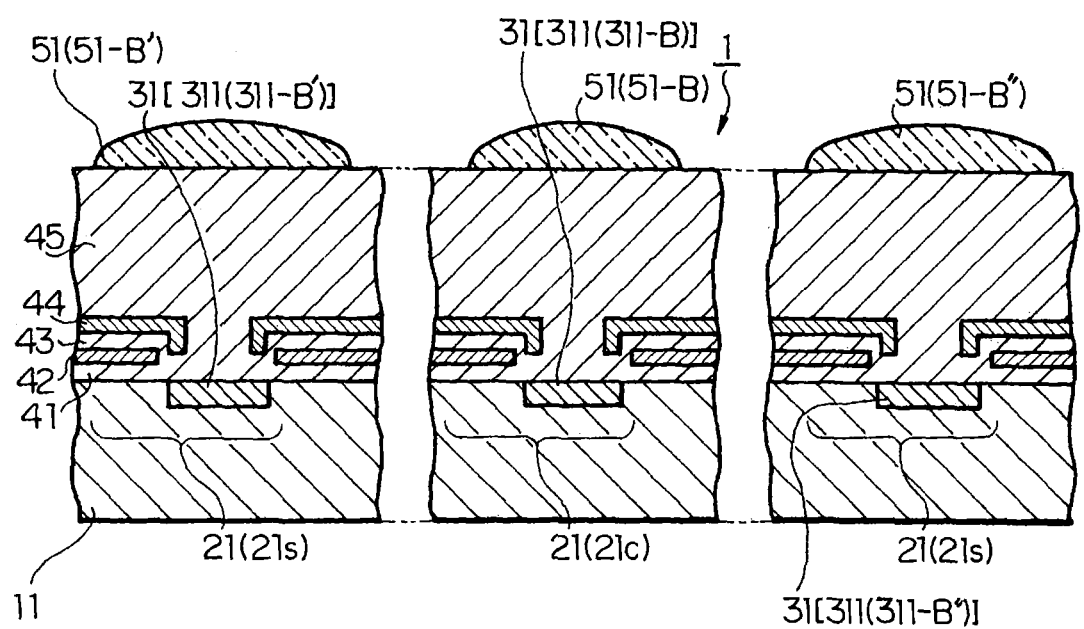
FIG. 1 is a schematic cross-sectional view of a solid-state imaging device according to the present invention.
Figure 2:
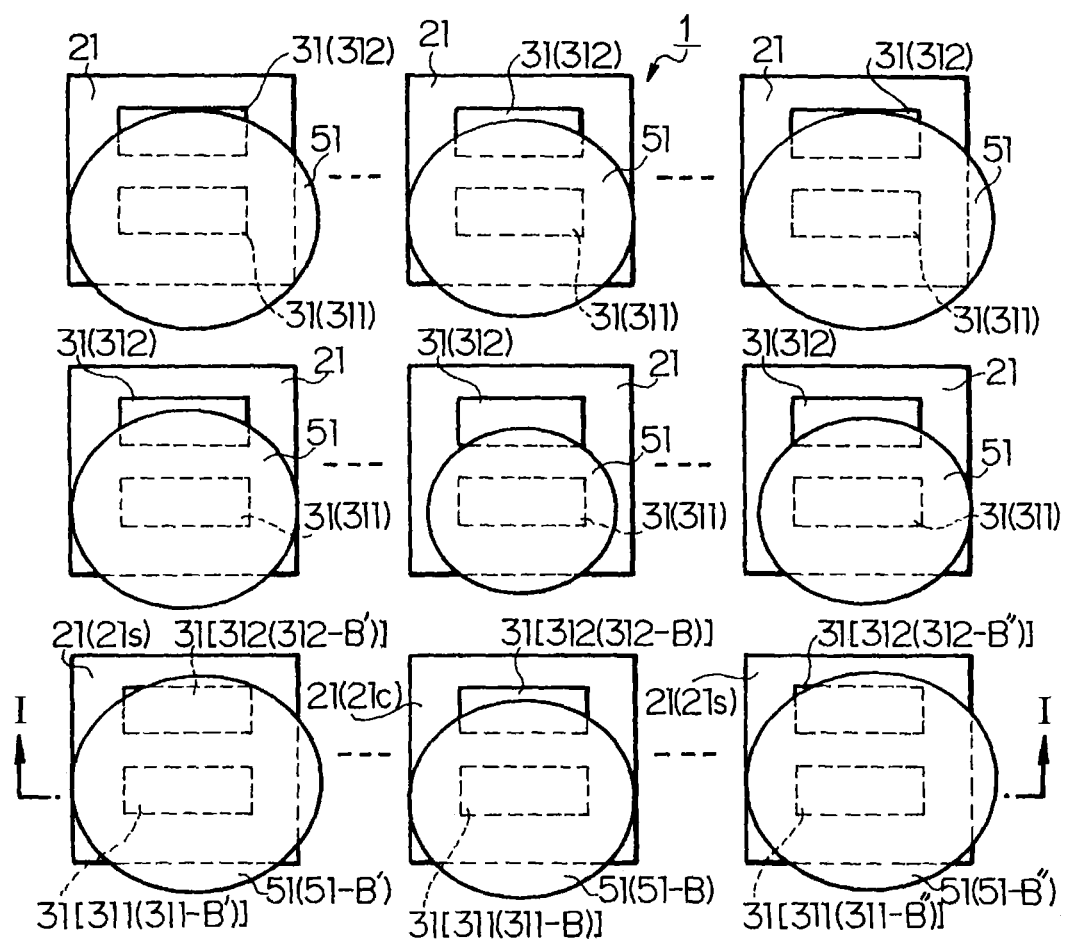
FIG. 2 is a plan view of a solid-state imaging device according to an embodiment of the present invention.

As shown in FIGS. 1 and 2, three or more pixel regions 21 are formed on a semiconductor substrate 11 in at least one direction (in FIG. 2, two directions) of two different directions along a principal surface of the semiconductor substrate 11. Each of the pixel regions 21 includes a plurality of photoelectric conversion regions 31, e.g., two photoelectric conversion regions 31 (311 and 312). The photoelectric conversion regions 311 and 312 have different sensitivities (light sensitivities). The photoelectric conversion region 311 has a higher sensitivity than the photoelectric conversion region 312.

In this solid-state imaging device, the high-sensitivity photoelectric conversion regions 311 in peripheral pixel regions 21s in the pixel regions 21 have a higher sensitivity than the high-sensitivity photoelectric conversion region 311 in a central pixel region 21c in the pixel regions 21.

Also in the pixel regions 21 in either the vertical or horizontal direction viewed in FIG. 2, the high-sensitivity photoelectric conversion regions 311 in the peripheral pixel regions 21s have a higher sensitivity than the high-sensitivity photoelectric conversion region 311 in the central pixel region 21c. Thus, the high-sensitivity photoelectric conversion region 311 in the vertically and horizontally central pixel region 21c of the pixel regions 21 that are arranged in the vertical and horizontal directions viewed in FIG. 2 has a lower sensitivity than the high-sensitivity photoelectric conversion regions 311 in the other pixel regions of the pixel regions 21.

Although not shown, a charge transfer region is formed adjacently to a readout region at one side of each of the photoelectric conversion regions 31, and pixels each formed of the photoelectric conversion 31, the readout region, and the vertical charge transfer region are separated by channel-stop regions.

The semiconductor substrate 11 includes an electrode 42 that overlies the vertical charge transfer region and the readout region, with an insulator film 41 therebetween, and an insulator film 43 that overlies the electrode 42. The insulator film 43 is further covered with a light-shielding electrode 44 so that an opening is positioned at the photoelectric conversion region 31. The photoelectric conversion region 31, the light-shielding electrode 44, and the other layers are further covered with a planar transparent insulator film 45. For example, the insulator film 45 is formed of, from the bottom, a passivation film that covers the light-shielding electrode 44, the photoelectric conversion region 31, and the other layers, a planarizing film for planarizing irregularities of the passivation film, a color filter that overlies the planarizing film, etc.

The pixel regions 21 further include condenser lenses 51 for focusing incident light onto the photoelectric conversion regions 21, generally called a microlens array. For example, each of the condenser lenses 51 is formed so that the center of the condenser lens 51 is positioned above the center of the high-sensitivity photoelectric conversion region 311 in the pixel regions 21 so that the center of the focused light is directed to the photoelectric conversion region 311.

As viewed from one direction in FIG. 2, the condenser lenses 51-B, 51-B', and 51-B" are formed above the center of the photoelectric conversion regions 311-B, 311-B', and 311-B", respectively. The photoelectric conversion regions 312-B, 312-B', and 312-B" are partially covered with the condenser lenses 51-B, 51-B', 51-B", respectively. Portions of the photoelectric conversion regions 312-B' and 312-B" that are not covered with the condenser lenses 51-B' and 51-B" are smaller than a portion of the photoelectric conversion region 312-B that is not covered with the condenser lens 51-B. Thus, the photoelectric conversion regions 312-B' and 312-B" have a lower sensitivity than the photoelectric conversion region 312-B.

In FIG. 2, each of the pixel regions 21 includes two photoelectric conversion regions 311 and 312 having different sensitivities; each pixel region 21 may include a plurality of photoelectric conversion regions 31 more than two. That is, each pixel region 21 may include n photoelectric conversion regions 31, where n is an integer more than one.

The photoelectric conversion regions 311 having the highest sensitivity in the pixel regions 21 through the photoelectric conversion regions 312 having the n-th (in FIG. 2, the second) highest sensitivity are arranged in a similar manner in the pixel regions 21, where n is an integer more than one. In FIG. 2, the high-sensitivity photoelectric conversion regions 311 are formed in a lower portion of the pixel regions 21, and the low-sensitivity photoelectric conversion regions 312 are formed in an upper portion of the pixel regions 21.

In order to improve shading, for example, the condenser lenses 51 formed over the peripheral pixel regions 21s are larger than the condenser lens 51 formed over the central pixel region 21c. The sizes of the condenser lenses 51 depend upon the degree of shading. Since the peripheral pixel regions 21s include more oblique incident light components, desirably, larger condenser lenses 51 are formed over the peripheral pixel regions 21s.

In the first embodiment, the condenser lenses 51 formed over the peripheral pixel regions 21s are larger than the condenser lens 51 formed over the central pixel region 21c in the pixel regions 21 in order to improve shading. Alternatively, the condenser lenses 51 formed over the peripheral pixel regions 21s may be obliquely shifted in the column or row direction or in a combination of the row and column directions of the pixel regions 21 with respect to the condenser lens 51 formed over the central pixel region 21c in order to improve shading. The direction in which the condenser lenses 51 are shifted depends upon the arrangement of the photoelectric conversion regions 31 in the pixel regions 21.

In the solid-state imaging device of the present invention, the sensitivity of the high-sensitivity photoelectric conversion regions 311-B' and 311-B" in the peripheral pixel regions 21s in the pixel regions 21 is actually higher than that of the high-sensitivity photoelectric conversion region 311B in the central pixel region 21c. Thus, so-called shading caused by more oblique incident light components in the light incident on the peripheral portion than in the central portion of the solid-state imaging device, namely, shading caused by the high-sensitivity photoelectric conversion regions 311 in the pixel regions 21, can be corrected for. Therefore, the solid-state imaging device provides high-quality captured images.

Second Embodiment

The first embodiment may cause worse shading in low-sensitivity pixels as a result of shading correction in high-sensitivity pixels. A solid-state imaging device according to a second embodiment of the present invention corrects for worse shading caused in low-sensitivity pixels.

In the second embodiment, a signal processing circuit (not shown) external to or on the same chip as the solid-state imaging device of the second embodiment corrects for gains of the central pixel region 21c and the peripheral pixel regions 21s shown in FIGS. 1 and 2 in accordance with the f values of the condenser lenses 51.

In the solid-state imaging device, for example, if the high-sensitivity photoelectric conversion regions 311 in the central and peripheral pixel regions 21c and 21s of the pixel regions 21 shown in FIGS. 1 and 2 are suppressed from causing shading, the low-sensitivity photoelectric conversion regions 312 may cause worse shading. In this case, the signal processing circuit corrects for the gains of the central and peripheral pixel regions 21c and 21s in accordance with the f values to correct for shading caused in the regions other than the high-sensitivity photoelectric conversion regions 311 in the pixel regions 21. Therefore, the solid-state imaging device captures high-quality images.

Third Embodiment

Figure 3:
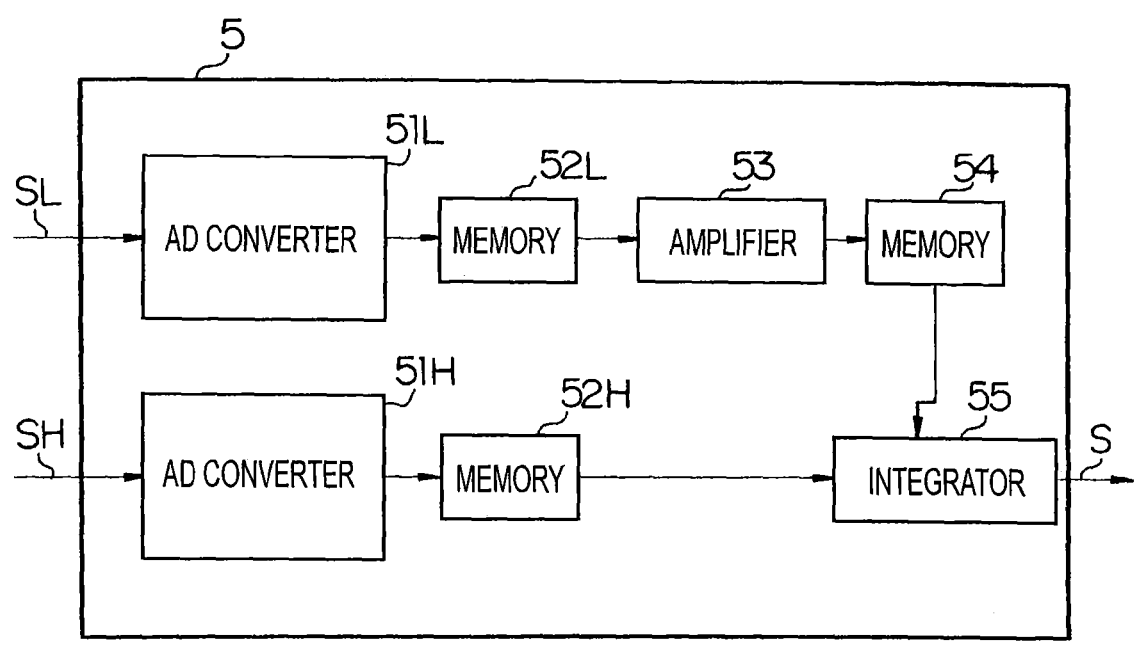
FIG. 3 is a block diagram of a signal processing circuit according to an embodiment of the present invention.
Figure 4:
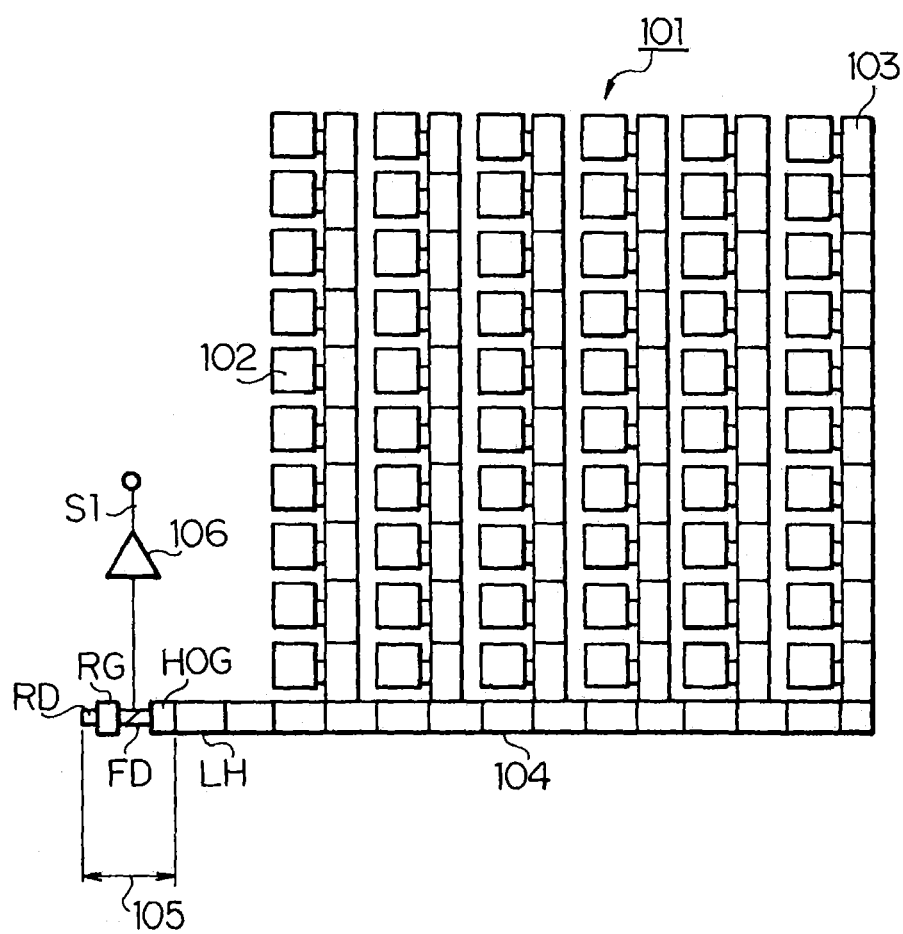
FIG. 4 is a diagram showing the basic structure of a solid-state imaging device of the related art.

FIG. 3 is a block diagram of a signal processing circuit 5 according to a third embodiment of the present invention.

As shown in FIG. 3, the signal processing circuit 5 includes an analog-to-digital (AD) conversion circuit 51H for performing AD conversion on a signal SH output from a high-sensitivity photoelectric conversion region, and an AD conversion circuit 51L for performing AD conversion on a signal SL output from a low-sensitivity photoelectric conversion region.

The AD conversion circuit 51H is connected to a memory 52H for temporarily storing the digital signal converted by the AD conversion circuit 51H, and the AD conversion circuit 51L is connected to a memory 52L for temporarily storing the digital signal converted by the AD conversion circuit 51L. The memory 52L is connected to an amplification circuit 53 for multiplying the signal read into the memory 52L by a coefficient that is determined for each pixel region. The amplification circuit 53 is connected to a memory 54 for temporarily storing the amplified signal. The memory 52H and the memory 54 are connected to an adding circuit 55 that adds the signal stored in the memory 52H and the memory 54 to generate a pixel signal S. The memory 54 is not essential, and the adding circuit 55 may add the signal output from the amplification circuit 53 and the signal output from the memory 52H to generate a pixel signal.

The signal processing circuit 5 of the present invention corrects for the gains of the central pixel region 21c and the peripheral pixel regions 21s in the pixel regions 21 shown in FIGS. 1 and 2 in accordance with the f values of the condenser lenses 51. For example, if the high-sensitivity photoelectric conversion regions 311 in the central and peripheral pixel regions 21c and 21s of the pixel regions 21 are suppressed from causing shading, the low-sensitivity photoelectric conversion regions 312 may cause worse shading.

The gain correction of the signal processing circuit 5 allows shading caused in the regions other than the high-sensitivity photoelectric conversion regions 311 in the pixel regions 21, i.e., shading caused in the photoelectric conversion regions 312, to be corrected for. Therefore, the solid-state imaging device provides high-quality captured images.

Due to its high sensitivity, the human eye is sensitive to noise components in a captured image in a low-sensitivity photoelectric conversion region. Thus, shading correction in a high-sensitivity photoelectric conversion region is performed by changing the amount of incident light depending upon the photoelectric conversion region in a central portion or the photoelectric conversion region in a peripheral portion. In this case, the incident light in a low-sensitivity photoelectric conversion region may suffer more shading; this shading is corrected for by the signal processing circuit 5 by performing gain correction.

This correction method is more susceptible to noise in the signal processing circuit 5. However, due to its low sensitivity to a high-brightness signal, the human eye does not perceive this noise.

What is claimed is:
1. A solid-state imaging device comprising:
a semiconductor substrate having a surface;
three or more pixel regions formed in at least one direction of two different directions along the principal surface of the semiconductor substrate, the three or more pixel regions comprising a central pixel region and peripheral pixel regions around the central pixel region, each pixel region including a plurality of photoelectric conversion regions having different sensitivities,
wherein the photoelectric conversion region having the highest sensitivity in the peripheral pixel regions has a higher sensitivity than the photoelectric conversion region having the highest sensitivity in the central pixel region; and
a signal processing circuit configured to process a signal that is photoelectrically converted by the pixel regions, the signal processing circuit being included in or being external to the solid-state imaging device, wherein the signal processing circuit corrects for gains of the central pixel region and the peripheral pixel regions in accordance with an f value and corrects for shading that is caused in a region other than the photoelectric conversion regions having the highest sensitivity in the pixel regions, and the signal processing circuit includes:
- a multiplying circuit that multiplies a signal output from the region other than the photoelectric conversion regions having the highest sensitivity in the pixel regions or a signal obtained by performing signal processing on the output signal by a coefficient that is determined for each of the pixel regions; and
- an adding circuit that adds the signal output from the region other than the photoelectric conversion regions having the highest sensitivity in the pixel regions or the signal obtained by performing signal processing on the output signal to the signal multiplied by the coefficient.

2. The solid-state imaging device according to claim 1, wherein the signal processing circuit further includes an analog-to-digital converter circuit configured to perform analog-to-digital conversion on the signal.

3. The solid-state imaging device according to claim 2, wherein the signal processing circuit further includes a memory configured to temporarily store an output of the analog-to-digital converter.

4. The solid-state imaging device according to claim 1, wherein the signal processing circuit further includes a memory configured to temporarily store an output of the multiplying circuit.

5. A signal processing circuit for processing a signal that is photoelectrically converted by a plurality of pixel regions of a solid-state imaging device, the plurality of pixel regions comprising a central pixel region and peripheral pixel regions around the central pixel region, the signal processing circuit being included in or being external to the solid-state imaging device, said signal processing circuit comprising a circuit that corrects for gains of the central pixel region and the peripheral pixel regions in accordance with an f value, the signal processing circuit further comprising:
- an amplifying circuit that multiplies a signal output from a region other than a photoelectric conversion region having the highest sensitivity in the pixel regions or a signal obtained by performing signal processing on the output signal by a coefficient that is determined for each of the pixel regions; and
- an adding circuit that adds the signal output from the region other than the photoelectric conversion region having the highest sensitivity in the pixel regions or the signal obtained by performing signal processing on the output signal to the signal multiplied by the coefficient.

6. The signal processing circuit according to claim 5, further comprising an analog-to-digital converter circuit configured to perform analog-to-digital conversion on the signal.

7. The signal processing circuit according to claim 6, further comprising a memory configured to temporarily store an output of the analog-to-digital converter.

8. The signal processing circuit according to claim 5, further comprising a memory configured to temporarily store an output of the multiplying circuit.

9. A solid-state imaging device comprising:
- a pixel region having a high-sensitivity photoelectric conversion region and a low-sensitivity photoelectric conversion region;
- a lens; and
- a signal processing circuit configured to process a signal output of the pixel region, wherein the signal processing circuit is configured to correct for gains of the pixel region in accordance with an f value of the lens and to correct for shading in the low-sensitivity photoelectric conversion region, and the signal processing circuit includes:
- an amplifying circuit configured to multiply a signal output from the low-sensitivity photoelectric conversion region or a signal obtained by performing signal processing on the output signal by a coefficient that is determined for each of the high-sensitivity and low-sensitivity photoelectric conversion regions; and
- an adding circuit that adds the signal output from the low-sensitivity photoelectric conversion region or the signal obtained by performing signal processing on the output signal to the signal multiplied by the coefficient.

10. The solid-state imaging device according to claim 9, wherein the signal processing circuit further includes an analog-to-digital converter circuit configured to perform analog-to-digital conversion on the signal.

11. The solid-state imaging device according to claim 10, wherein the signal processing circuit further includes a memory configured to temporarily store an output of the analog-to-digital converter.

12. The solid-state imaging device according to claim 9, wherein the signal processing circuit further includes a memory configured to temporarily store an output of the multiplying circuit.

* * * * *